United States Patent [19]

Grodzinski et al.

[11] Patent Number: 5,432,809
[45] Date of Patent: Jul. 11, 1995

[54] VCSEL WITH AL-FREE CAVITY REGION

[75] Inventors: Piotr Grodzinski, Chandler; Michael S. Lebby, Apache Junction, both of Ariz.; Donald E. Ackley, Lambertville, N.J.

[73] Assignee: Motorola, Inc., Schaumburg, Ill.

[21] Appl. No.: 261,502

[22] Filed: Jun. 15, 1994

[51] Int. Cl.⁶ .................. H01S 3/085; H01S 3/131
[52] U.S. Cl. ........................ 372/45; 372/43; 372/50
[58] Field of Search .............. 372/43, 45, 50

[56] References Cited

U.S. PATENT DOCUMENTS

| | | | |
|---|---|---|---|
| 4,991,179 | 2/1991 | Deppe et al. | 372/45 |
| 5,216,686 | 6/1993 | Holm et al. | 372/45 |
| 5,274,655 | 12/1993 | Shieh et al. | 372/45 |
| 5,317,587 | 5/1994 | Ackley et al. | 372/45 |
| 5,328,854 | 7/1994 | Vakshoori et al. | 437/24 |

*Primary Examiner*—Rodney B. Bovernick
*Assistant Examiner*—Yisun Song
*Attorney, Agent, or Firm*—Eugene A. Parsons

[57] ABSTRACT

Patterned-mirrors for VCSELs are fabricated by forming a first mirror stack of a plurality of pairs of relatively high and low index of refraction layers of AlGaAs, forming an active region of aluminum-free material on the first mirror stack, and forming a second mirror stack of a plurality of pairs of relatively high and low index of refraction layers of AlGaAs. The second mirror stack can be selectively etched to the active region by utilizing the aluminum-free active region as an etch stop.

34 Claims, 2 Drawing Sheets

VCSEL WITH AL-FREE CAVITY REGION

FIELD OF THE INVENTION

The present invention pertains to vertical cavity surface emitting lasers (VCSELs) and more specifically to VCSELs with a more reliable cavity or active region.

BACKGROUND OF THE INVENTION

In prior art semiconductor lasers, as typically disclosed in U.S. Pat. No. 5,172,384, entitled "Low Threshold Current Laser", issued Dec. 15, 1992, it is common to form an active region with an indium gallium arsenide quantum well, having guiding layers and cladding layers of aluminum gallium arsenide on both sides thereof. Further, it is typical to form Bragg reflectors, or mirror stacks, on each side of the active region, which mirror stacks generally include aluminum. The epitaxial configuration of VCSELs is well defined, however, various processing schemes can be utilized.

The most commonly used structure involves proton implantation in order to separate individual devices on a substrate. The advantage of this structure is its planar character; it suffers, however from instability of optical lateral mode and relatively high threshold currents due to the large current spreading.

In instances where the semiconductor laser is to be a ridge waveguide, or patterned mirror, laser, the upper mirror stack is etched to the correct depth by knowing the exact rate of etch and timing the etch process. This prior art method of etching the upper mirror stack is very difficult and inaccurate. Thus, the prior art patterned mirror VCSELs have relatively low threshold currents but lack the needed reliability.

fin some instances, such as in an application entitled "VCSEL With Vertical Offset Operating Region Providing a Lateral Waveguide and Current Limiting and Method of Fabricating", Ser. No. 08/028,015, filed Mar. 8, 1993, now U.S. Pat. No. 5,351,257 including an etch-stop layer in the upper mirror stack has been proposed to automatically stop the etch at a desired depth.

In a U.S. Pat. No. 5,293,392, entitled "Top Emitting VCSEL with Etch Stop Layer", issued Mar. 8, 1994 an etch stop layer is grown in the second, or upper, mirror stack and utilized to automatically stop the etch at a desired level. While the etch stop method utilizes the excellent control achieved in HOVPE growth to define the patterned mirror height, the growth of a layer of dissimilar material (the etch stop layer) is required which adds some complication to the fabrication process.

To provide such an etch-stop layer, a layer from a different material system must be epitaxially grown between layers of the normal or desired material system. Thus, epitaxial layers of the normal or desired material system are grown to a desired height. The epitaxial growth is then stopped and restarted with the different material system until the etch-stop layer of desired thickness is grown. The original epitaxial growth is then continued until the device is completed. Generally, this is difficult and requires substantial effort and time to complete.

Accordingly, it is desirable to provide a method of easily and accurately etching the upper mirror stack of a VCSEL.

It is a purpose of the present invention to provide a method of easily and accurately fabricating patterned mirror VCSELs.

It is a further purpose of the present invention to provide a method of fabricating VCSELs which is relatively easy to perform and which accurately stops the etching process before damaging the active region.

It is a further purpose of the present invention to provide a method of fabricating VCSELs which results in VCSELs that are highly reliable, relative to prior art VCSELs.

It is a further purpose of the present invention to provide VCSELs which are highly reliable, relative to prior art VCSELs.

SUMMARY OF THE INVENTION

The above problems are at least partially solved and the above purposes are realized in a method of fabricating patterned-mirrors for VCSELs including forming a first mirror stack of a first conductivity type, forming an active region on the first mirror stack, the active region being formed of aluminum-free material and forming a second mirror stack of a second conductivity type on the active region. The first and second mirror stacks are formed of a plurality of pairs of relatively high and low index of refraction layers of AlGaAs. The second mirror stack can be selectively etched to the active region by utilizing the aluminum-free active region as an etch stop.

BRIEF DESCRIPTION OF THE DRAWINGS

Referring to the drawings.

DESCRIPTION OF THE PREFERRED EMBODIMENT

Figure 1:
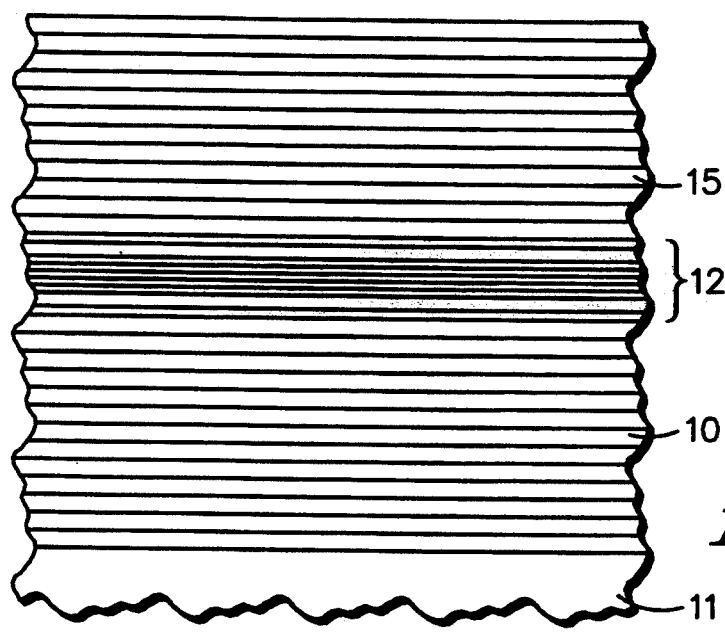
FIG. 1 is a simplified sectional view of a first stage in the fabrication of a VCSEL in accordance with the present invention.

Referring to FIG. 1 a simplified sectional view of an intermediate structure realized in various different steps of a fabrication method in accordance with the present invention are illustrated. In particular, FIG. 1 illustrates a first mirror stack 10 having an active region 12 formed thereon. Mirror stack 10 is generally formed, for example, by epitaxially growing a plurality of layers of semiconductor material with alternating indexes of refraction on a substrate 11. Some examples of materials that can be used for this purpose are: alternating layers of $Al_{0.15}Ga_{0.85}As$ and $Al_{0.80}Ga_{0.20}As$; alternating layers of GaAs and $Al_{0.80}Ga_{0.20}As$; etc. Each pair of alternating layers are grown to a thickness of one quarter of the emission wavelength propagating in the layers, and the number of pairs is chosen to provide as much reflectivity of light as possible while limiting the stack to a practical number.

A second mirror stack 15 is formed on the upper surface of active region 12 by, for example, epitaxially growing pairs of semiconductor layers as described in conjunction with mirror stack 10. Generally, the pairs of layers will be formed of materials similar to those of mirror stack 10 and the thicknesses will be similar to provide the proper reflectivity of a selected wavelength or spectrum of wavelengths. Also, the first and second mirror stacks are doped with opposite conductivity types to form a two terminal (diode) structure for the flow of electrical current therethrough. In this specific embodiment, for example, mirror stack 10 is doped for n-type conductivity and mirror stack 15 is doped for p-type conductivity.

Active region 12 generally includes one or more quantum wells separated by barrier layers with a spacer or cladding layer on either side thereof. The quantum wells, barrier layers and spacer layers are also grown epitaxially. The quantum wells produce photons (light) in accordance with a well known phenomenon when properly energized by electrical current applied thereacross. In general, the greater the current applied to active region 12 the greater the number of photons generated. The photons are reflected by the mirror stacks and produce the well known lasing effect that ultimately produces the emitted light. The wavelength of the light is determined by the materials utilized in the quantum well or wells in active region 12 and the thickness of the alternating pairs of layers in the mirror stacks.

Active region 12 is formed from a material system different than the material system of mirror stacks 10 and 15 with the different material system being chosen so that mirror stack 15 can be selectively etched to form a patterned mirror VCSEL, if desired. Further, aluminum is susceptible to oxidation and, it is believed, contributes substantially to the unreliability of active region 12, eventually, resulting in the failure of the VCSEL. By selecting the different material system of active region 12 so that it does not contain aluminum, the reliability and life span of the VCSELs is substantially improved.

Figure 2:
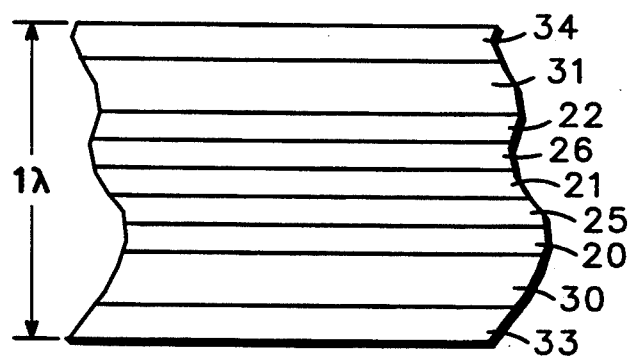
FIG. 2 is a greatly enlarged sectional view of a portion of the structure of FIG. 1.

Referring specifically to FIG. 2, a greatly enlarged and simplified sectional view of active region 12 for this specific embodiment is illustrated. In this specific embodiment, active region 12 includes three quantum wells 20, 21 and 22 formed with barrier layers 25 and 26 sandwiched therebetween. Quantum wells 20, 21 and 22, separated by barrier layers 25 and 26, are sandwiched between spacer or guiding layers 30 and 31 which are in turn sandwiched between cladding layers 33 and 34. Generally, spacer layers 30 and 31 and cladding layers 33 and 34 are graded to provide guiding action, as described in more detail in U.S. Pat. No. 5,172,384, described above and included herein by reference.

Figure 3:
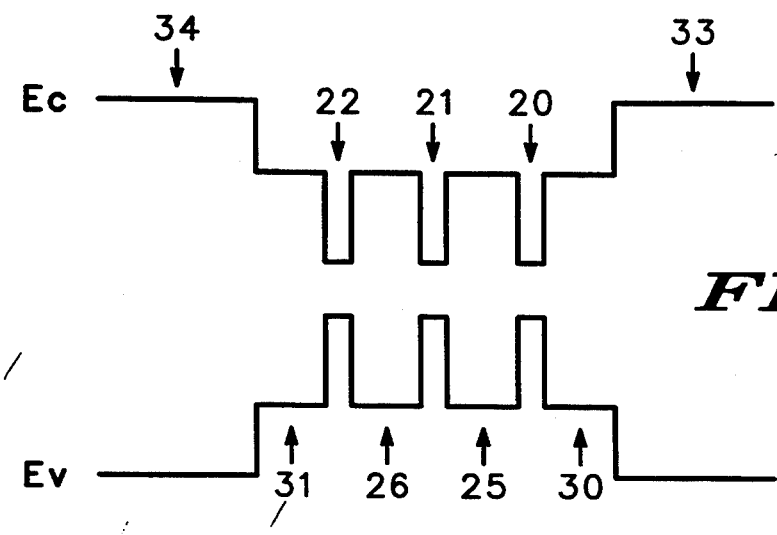
FIG. 3 is an energy diagram generally portraying the bandgaps for the materials utilized in the structure illustrated in FIG. 2.

InGaP/InGaAsP materials cover a suitable range of bandgaps needed for the present application (1.42 eV-1.9 eV at room temperature) while maintaining lattice matching to substrate 11, which in this embodiment is GaAs. In a first example, quantum wells 20, 21 and 22 are formed of GaAs with barrier layers 25 and 26 formed of $In_{0.27}Ga_{0.73}As_{0.44}P_{0.56}$ ($E_g=1.65$ eV). Quantum wells 20, 21 and 22 and barrier layers 25 and 26 are each formed approximately 100 angstroms thick. Spacer layers 30 and 31 are formed of $In_{0.27}Ga_{0.73}As_{0.44}P_{0.56}$ ($E_g=1.65$ eV) and cladding layers 33 and 34 are formed of $In_{0.49}Ga_{0.51}P$ lattice matched to GaAs. Individual thicknesses of the layers are chosen in such a way that active region 12 has the optical thickness of approximately a full wave in the semiconductor material. An energy diagram generally portraying the bandgaps for the materials described is illustrated in FIG. 3. In this example, the Bragg reflectors (first and second mirror stacks 10 and 15) are composed of $\frac{1}{4}\lambda$ alternating layers of $Al_{0.15}Ga_{0.85}As$ and $Al_{0.80}Ga_{0.20}As$.

In a second example, quantum wells 20, 21 and 22 are strained quantum wells formed of $In_{0.18}Ga_{0.82}As$ with barrier layers 25 and 26 formed of GaAs. Quantum wells 20, 21 and 22 and barrier layers 25 and 26 are each formed approximately 100 angstroms thick. Spacer layers 30 and 31 are formed of GaAs and cladding layers 33 and 34 are formed of $In_{0.27}Ga_{0.73}As_{0.44}P_{0.56}$ ($E_g=1.65$ eV). Individual thicknesses of the layers are again chosen in such a way that active region 12 has the optical thickness of approximately a full wave in the semiconductor material. In this example, the Bragg reflectors (first and second mirror stacks 10 and 15) are composed of $\frac{1}{4}\lambda$ alternating layers of GaAs and $Al_{0.80}Ga_{0.20}As$.

Figure 4:
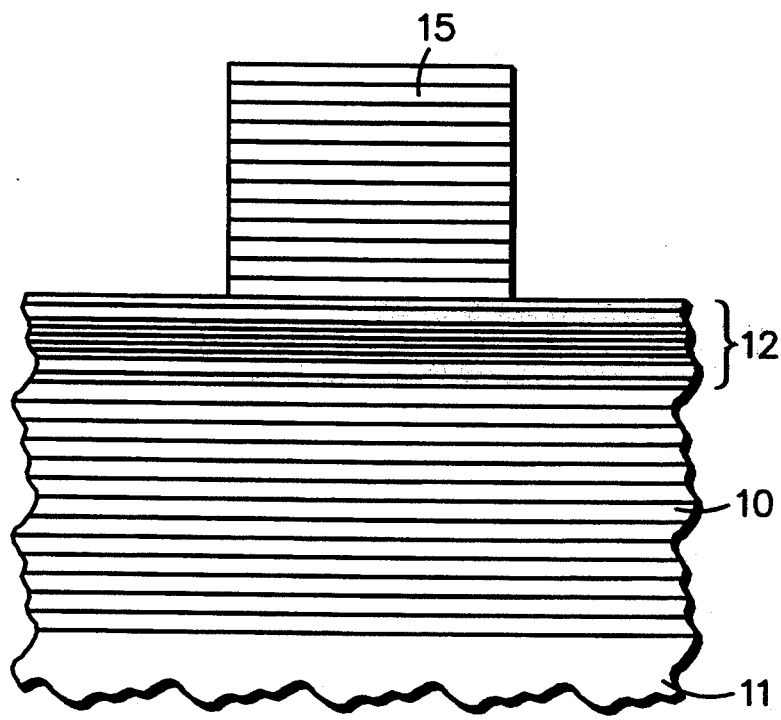
FIG. 4 is a simplified sectional view of a second stage in the fabrication of a VCSEL in accordance with the present invention.

With first mirror stack 10, active region 12 and second mirror stack 15 formed on substrate 11 as illustrated in FIG. 1 and including materials as described above, second mirror stack 15 is selectively etched, as illustrated in FIG. 4. Either wet or dry etch techniques can be performed, using $H_2O_2:H_2O:H_2SO_4/HCL:H_3PO_4$ based etchants. Due to the etch selectivity, patterned mirror, or ridge waveguide, VCSEL structures are formed by etching through top or second mirror stack 15, down to the top of active region 12. Because the etching is accurate and does not damage active region 12, good electrical current and optical confinement is achieved to obtain low thresholds, while still maintaining good reliability (relative to a planar VCSEL).

Figure 5:
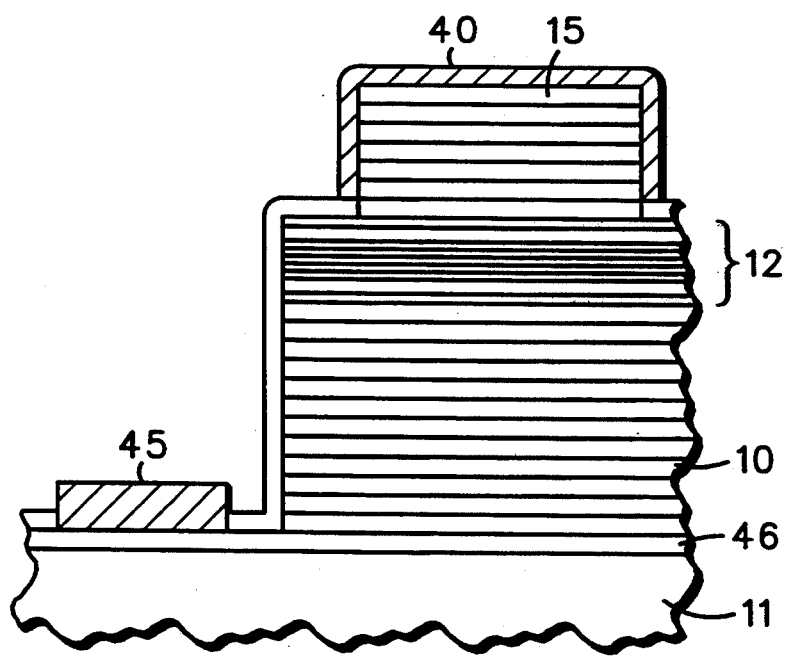
FIG. 5 is a simplified sectional view of a final stage in the fabrication of a VCSEL in accordance with the present invention.

As illustrated in FIG. 5, to complete the structure illustrated in FIG. 4, a p-type metallization 40 is formed on the exposed surface of upper mirror stack 15 by any known method. At least the portion of p-type metallization 40 overlying the upper surface of the mesa may be a transparent metal, such as ITO or the like. An n-type metallization 45 is formed in contact with mirror stack 10, for example on the upper surface of substrate 11, to provide another electrical contact for the VCSEL. Generally, a layer 46 of heavily doped semiconductor material is provided on the surface of substrate 11 to provide a better, low resistance contact to mirror stack 10 of the VCSEL. It will be understood that an electrical contact can be formed on the surface of substrate 11 opposite the surface on which mirror stack 10 if desired.

Thus, a new and improved method of fabricating VCSELs is disclosed and a new and improved method of fabricating patterned-mirrors for VCSELs is disclosed. Because the upper mirror stack is accurately and selectively etched, reliability is substantially increased. Also, because the active region of the VCSELs is aluminum-free, the reliability and the life span of the VCSELs is substantially increased. Further, because the selectivity of the etching is achieved by making the active region aluminum-free, fabrication of the VCSELs is not complicated by changes in material midway through the epitaxial growing process. That is, some changes in the epitaxial growing process must be made when moving from the lower mirror stack to the active region and then again when moving to the upper mirror stack. By making the changes in the material systems at this time a minimum amount of alterations in the epitaxial growing process is required.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating VCSELs comprising the steps of:
    forming a first mirror stack of a first conductivity type, the first mirror stack being formed of a plurality of pairs of relatively high and low index of refraction layers of AlGaAs;
    forming an active region on the first mirror stack, the active region being formed of aluminum-free material;
    forming a second mirror stack of a second conductivity type on the active region, the second mirror stack being formed of a plurality of pairs of relatively high and low index of refraction layers of AlGaAs; and
    wherein the active region includes all the layers between the first and second mirror stacks.

2. A method of fabricating VCSELs as claimed in claim 1 wherein the step of forming the active region of aluminum-free material includes forming the active region of alternate layers of GaAs and InGaAsP.

3. A method of fabricating VCSELs as claimed in claim 1 wherein the step of forming the active region of aluminum-free material includes forming the active region of three quantum well layers of GaAs having two barrier layers of InGaAsP sandwiched therebetween.

4. A method of fabricating VCSELs as claimed in claim 3 wherein the step of forming the active region of aluminum-free material further includes forming two spacer layers of InGaAsP with the three quantum wells and two barrier layers sandwiched therebetween.

5. A method of fabricating VCSELs as claimed in claim 4 wherein the step of forming the active region of aluminum-free material further includes forming two layers of InGaP and with the two spacer layers, the three quantum wells and the two barrier layers sandwiched therebetween.

6. A method of fabricating VCSELs as claimed in claim 5 wherein the step of forming the active region of aluminum-free material further includes forming the two layers of InGaP, the two spacer layers, the three quantum wells and the two barrier layers sandwiched therebetween approximately one optical wavelength thick.

7. A method of fabricating VCSELs as claimed in claim 1 wherein the step of forming the active region of aluminum-free material includes forming the active region of three quantum well layers of InGaAs having two barrier layers of GaAs sandwiched therebetween.

8. A method of fabricating VCSELs as claimed in claim 7 wherein the step of forming the active region of aluminum-free material further includes forming two spacer layers of GaAs with the three quantum wells and two barrier layers sandwiched therebetween.

9. A method of fabricating VCSELs as claimed in claim 8 wherein the step of forming the active region of aluminum-free material further includes forming two layers of InGaAsP and with the two spacer layers, the three quantum wells and the two barrier layers sandwiched therebetween.

10. A method of fabricating VCSELs as claimed in claim 9 wherein the step of forming the active region of aluminum-free material further includes forming the two layers of InGaAsP, the two spacer layers, the three quantum wells and the two barrier layers sandwiched therebetween approximately one optical wavelength thick.

11. A method of fabricating VCSELs as claimed in claim 1 wherein the steps of forming the first mirror stack and the second mirror stack of a plurality of pairs of relatively high and low index of refraction layers of AlGaAs includes forming the first and second mirror stacks of alternate layers of $Al_{0.15}Ga_{0.85}As$ and $Al_{0.80}Ga_{0.85}As$, respectively.

12. A method of fabricating patterned-mirrors for VCSELs comprising the steps of:
    forming a first mirror stack of a first conductivity type, the first mirror stack being formed of a plurality of pairs of relatively high and low index of refraction layers of AlGaAs;
    forming an active region on the first mirror stack, the active region being formed of aluminum-free material;
    forming a second mirror stack of a second conductivity type on the active region, the second mirror stack being formed of a plurality of pairs of relatively high and low index of refraction layers of AlGaAs;
    selectively etching the second mirror stack by utilizing the aluminum-free active region as an etch stop; and
    wherein the active region includes all the layers between the first and second mirror stacks.

13. A method of fabricating patterned-mirrors for VCSELs as claimed in claim 12 wherein the step of forming the active region of aluminum-free material includes forming the active region of alternate layers of GaAs and InGaAsP.

14. A method of fabricating patterned-mirrors for VCSELs as claimed in claim 12 wherein the step of forming the active region of aluminum-free material includes forming the active region of three quantum well layers of GaAs having two barrier layers of InGaAsP sandwiched therebetween.

15. A method of fabricating patterned-mirrors for VCSELs as claimed in claim 14 wherein the step of forming the active region of aluminum-free material further includes forming two spacer layers of InGaAsP with the three quantum wells and two barrier layers sandwiched therebetween.

16. A method of fabricating patterned-mirrors for VCSELs as claimed in claim 15 wherein the step of forming the active region of aluminum-free material further includes forming two layers of InGaP and with the two spacer layers, the three quantum wells and the two barrier layers sandwiched therebetween.

17. A method of fabricating patterned-mirrors for VCSELs as claimed in claim 16 wherein the step of forming the active region of aluminum-free material further includes forming the two layers of InGaP, the two spacer layers, the three quantum wells and the two barrier layers sandwiched therebetween approximately one optical wavelength thick.

18. A method of fabricating patterned-mirrors for VCSELs as claimed in claim 12 wherein the step of forming the active region of aluminum-free material includes forming the active region of three quantum well layers of InGaAs having two barrier layers of GaAs sandwiched therebetween.

19. A method of fabricating patterned-mirrors for VCSELs as claimed in claim 18 wherein the step of forming the active region of aluminum-free material further includes forming two spacer layers of GaAs with the three quantum wells and two barrier layers sandwiched therebetween.

20. A method of fabricating patterned-mirrors for VCSELs as claimed in claim 19 wherein the step of forming the active region of aluminum-free material further includes forming two layers of InGaAsP and with the two spacer layers, the three quantum wells and the two barrier layers sandwiched therebetween.

21. A method of fabricating patterned-mirrors for VCSELs as claimed in claim 20 wherein the step of forming the active region of aluminum-free material further includes forming the two layers of InGaAsP, the two spacer layers, the three quantum wells and the two barrier layers sandwiched therebetween approximately one optical wavelength thick.

22. A method of fabricating VCSELs as claimed in claim 12 wherein the steps of forming the first mirror stack and the second mirror stack of a plurality of pairs of relatively high and low index of refraction layers of AlGaAs includes forming the first and second mirror stacks of alternate layers of $Al_{0.15}Ga_{0.85}As$ and $Al_{0.80}Ga_{0.85}As$, respectively.

23. A method of fabricating VCSELs as claimed in claim 12 wherein the step of selectively etching the second mirror stack by utilizing the aluminum-free active region as an etch stop includes performing a wet or a dry etch utilizing $H_2O_2:H_2O:H_2SO_4/HCL:H_3PO_4$ based etchants.

24. A VCSEL comprising:
a substrate;
a first mirror stack of a first conductivity type positioned on the substrate, the first mirror stack being formed of a plurality of pairs of relatively high and low index of refraction layers of AlGaAs;
an active region positioned on the first mirror stack, the active region being formed of aluminum-free material;
a second mirror stack of a second conductivity type positioned on the active region, the second mirror stack being formed of a plurality of pairs of relatively high and low index of refraction layers of AlGaAs; and
wherein the active region includes all the layers between the first and second mirror stacks.

25. A patterned mirror VCSEL comprising:
a substrate;
a first mirror stack of a first conductivity type positioned on the substrate, the first mirror stack being formed of a plurality of pairs of relatively high and low index of refraction layers of AlGaAs;
an active region positioned on the first mirror stack, the active region being formed of aluminum-free material;
a second mirror stack of a second conductivity type positioned on the active region, the second mirror stack being formed of a plurality of pairs of relatively high and low index of refraction layers of AlGaAs, the second mirror stack being patterned to the active region to define a lasing region; and
wherein the active region includes all the layers between the first and second mirror stacks.

26. A patterned mirror VCSEL as claimed in claim 25 wherein the active region of aluminum-free material includes three quantum well layers of GaAs having two barrier layers of InGaAsP sandwiched therebetween.

27. A patterned mirror VCSEL as claimed in claim 26 wherein the active region of aluminum-free material further includes two spacer layers of InGaAsP with the three quantum wells and two barrier layers sandwiched therebetween.

28. A patterned mirror VCSEL as claimed in claim 27 wherein the active region of aluminum-free material further includes two layers of InGaP with the two spacer layers, the three quantum wells and the two barrier layers sandwiched therebetween.

29. A patterned mirror VCSEL as claimed in claim 28 wherein the active region of aluminum-free material further includes the two layers of InGaP, the two spacer layers, the three quantum wells and the two barrier layers sandwiched therebetween and formed approximately one optical wavelength thick.

30. A patterned mirror VCSEL as claimed in claim 25 wherein the active region of aluminum-free material includes three quantum well layers of InGaAs having two barrier layers of GaAs sandwiched therebetween.

31. A patterned mirror VCSEL as claimed in claim 30 wherein the active region of aluminum-free material further includes two spacer layers of GaAs with the three quantum wells and two barrier layers sandwiched therebetween.

32. A patterned mirror VCSEL as claimed in claim 31 wherein the active region of aluminum-free material further includes two layers of InGaAsP with the two spacer layers, the three quantum wells and the two barrier layers sandwiched therebetween.

33. A patterned mirror VCSEL as claimed in claim 32 wherein the active region of aluminum-free material further includes the two layers of InGaAsP, the two spacer layers, the three quantum wells and the two barrier layers sandwiched therebetween and formed approximately one optical wavelength thick.

34. A patterned mirror VCSEL as claimed in claim 25 wherein the first mirror stack and the second mirror stack of a plurality of pairs of relatively high and low index of refraction layers of AlGaAs each include alternate layers of $Al_{0.15}Ga_{0.85}As$ and $Al_{0.80}Ga_{0.85}As$, respectively.

* * * * *